(12) United States Patent
Hayashi et al.

(10) Patent No.: US 7,509,110 B2
(45) Date of Patent: Mar. 24, 2009

(54) HIGH-ORDER HARMONIC REJECTION MIXER USING MULTIPLE LO PHASES

(75) Inventors: Takayuki Hayashi, Lake Forest, CA (US); Danilo Manstretta, Stradella (IT)

(73) Assignee: Broadcom Corporation, Irvine, CA (US)

( * ) Notice: Subject to any disclaimer, the term of this patent is extended or adjusted under 35 U.S.C. 154(b) by 453 days.

(21) Appl. No.: 11/261,653

(22) Filed: Oct. 31, 2005

(65) Prior Publication Data

US 2006/0205370 A1    Sep. 14, 2006

Related U.S. Application Data

(60) Provisional application No. 60/661,201, filed on Mar. 14, 2005.

(51) Int. Cl.
     *H04B 1/00*          (2006.01)
     *H04B 1/26*          (2006.01)

(52) U.S. Cl. ........................ 455/302; 455/318; 455/323; 455/326; 455/333

(58) Field of Classification Search ................ 455/296, 455/302–309, 313–333
See application file for complete search history.

(56) References Cited

U.S. PATENT DOCUMENTS 5,708,399 A * 1/1998 Fujii et al. .................. 332/103
6,029,059 A * 2/2000 Bojer .......................... 455/326
6,073,001 A * 6/2000 Sokoler ....................... 455/323
6,144,845 A * 11/2000 Durec ......................... 455/285
7,120,414 B2 * 10/2006 Kim et al. ................... 455/313
7,130,604 B1 * 10/2006 Wong et al. ................. 455/302

OTHER PUBLICATIONS

Weldon, J.A. et al., "A 1.75-GHz Highly Integrated Narrow-Band CMOS Transmitter With Harmonic-Rejection Mixers," *IEEE Journal of Solid-State Circuits*, vol. 36, No. 12, pp. 2003-2015 (Dec. 2001).

* cited by examiner

*Primary Examiner*—Duc M Nguyen
(74) *Attorney, Agent, or Firm*—Sterne, Kessler, Goldstein & Fox P.L.L.C.

(57) ABSTRACT

A mixer produces an improved output signal during frequency translation of an input signal using a local oscillator (LO) signal. The mixer includes five component mixers connected in parallel. Each component mixer uses a phase-shifted version of the LO signal for frequency translation to produce a component output signal from the input signal. The component output signals are scaled according to corresponding gain factors and combined to form the output signal. When the mixer is used in a receiver, the phases of the component LO signals and the gain factors are configured to substantially cancel overlapping baseband versions of component input signals located at the third, fifth, seventh and ninth harmonics of the LO frequency. When used in a transmitter, the same phase and gain factor configurations substantially cancel third, fifth, seventh and ninth harmonics within the output signal.

21 Claims, 11 Drawing Sheets

HIGH-ORDER HARMONIC REJECTION MIXER USING MULTIPLE LO PHASES

CROSS REFERENCE TO RELATED APPLICATIONS

This application claims the benefit of U.S. Provisional Patent Application No. 60/661,201, filed Mar. 14, 2005, which is incorporated herein by reference in its entirety.

BACKGROUND OF THE INVENTION

1. Field of the Invention

The present invention generally relates to mixers. More specifically, the present invention provides a mixer using multiple phases of a local oscillator (LO) to provide improved high-order harmonic rejection.

2. Background Art

A mixer is a circuit that functions as a mathematical multiplier of two input signals. A mixer is used in a receiver to down-convert a radio frequency (RF) signal to a baseband signal or intermediate frequency (IF) signal. A mixer is used in a transmitter to up-convert a baseband signal or an IF signal to an RF signal. In this way, a mixer provides an output signal that is a frequency translated version of an input signal.

A mixer typically uses a local oscillator (LO) signal generated by a voltage controlled oscillator (VCO) to down-convert or up-convert an input signal. The local oscillator signal often approximates a square waveform, especially at low frequencies. Unlike a single-tone sinusoidal waveform, a square waveform contains harmonics at odd multiples of the fundamental frequency of the LO signal. Consequently, the output signal generated by a mixer using a square waveform as an LO signal can contain harmonics related to the LO frequency. Specifically, during up-conversion, the harmonics of the LO signal can produce replicas of the baseband or IF signal at odd multiples of the LO signal frequency. Further, during down-conversion, the harmonics of the LO signal can cause RF input signals at odd multiples of the LO frequency to directly interfere with each other in a resulting baseband or IF signal.

Using a sinusoidal waveform as an LO signal does not remove the harmonics from the output signal of the mixer. Specifically, due to the switching action of the transistors used to implement the mixer, harmonics related to the LO signal can still appear in the output signal. To remove the harmonics, pre-filtering is preformed when the mixer is used for down-conversion and post-filtering is preformed when the mixer is used for up-conversion.

SUMMARY OF THE INVENTION

Accordingly, the present invention provides a mixer that eliminates the need for filtering to produce a frequency translated output signal with improved rejection of high-order harmonic effects.

A mixer produces an improved output signal during frequency translation of an input signal using a local oscillator (LO) signal. The mixer includes five component mixers connected in parallel. Each component mixer uses a phase-shifted version of the LO signal for frequency translation to produce a component output signal from the input signal. The component output signals are scaled according to corresponding gain factors and combined to form the output signal. When the mixer is used in a receiver, the phases of the component LO signals and the gain factors are configured to substantially cancel overlapping baseband versions of component input signals located at the third, fifth, seventh and ninth harmonics of the LO frequency. When used in a transmitter, the same phase and gain factor configurations substantially cancel third, fifth, seventh and ninth harmonics within the output signal.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings illustrate the present invention and, together with the description, further serve to explain the principles of the invention and to enable one skilled in the pertinent art to make and use the invention.

DETAILED DESCRIPTION OF THE INVENTION

Figure 1:
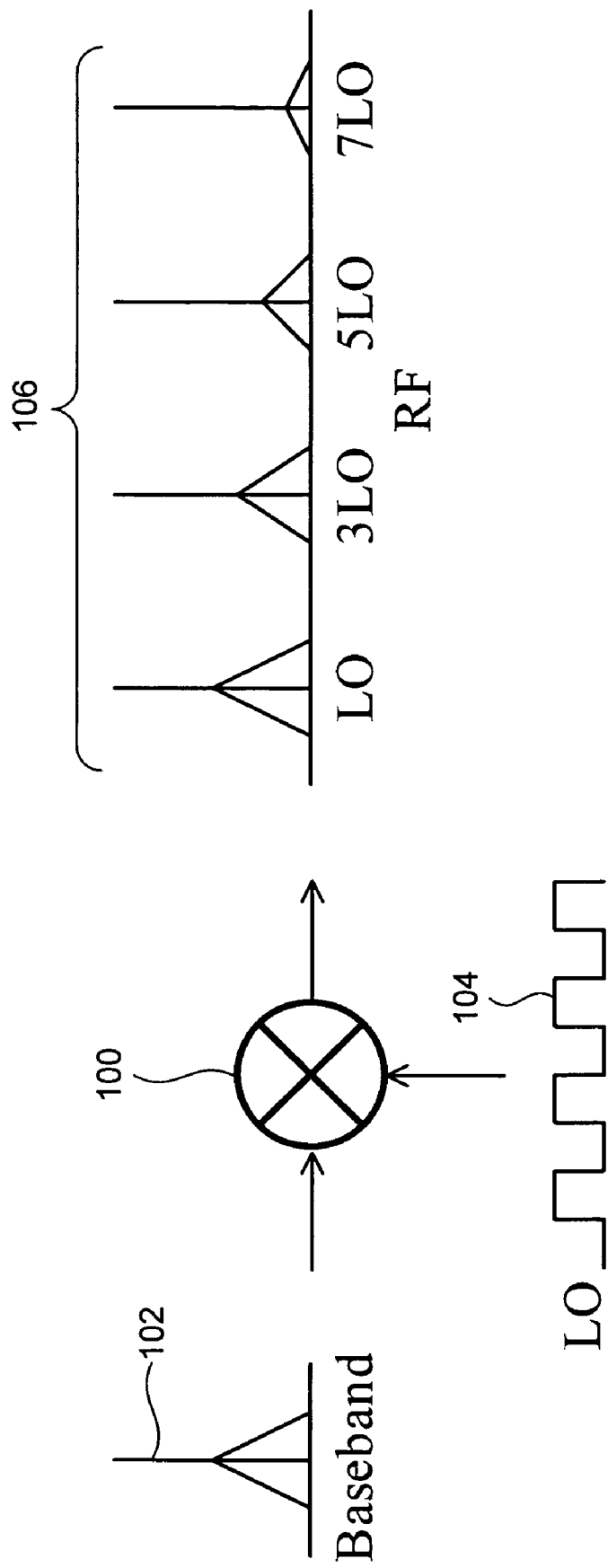
FIG. 1 illustrates a conventional switching mixer operating in a radio frequency (RF) transmitter.

FIG. 1 illustrates a conventional switching mixer 100 used in a radio frequency (RF) transmitter. The conventional switching mixer 100 receives a baseband signal 102. The conventional switching mixer 100 uses a local oscillator (LO) signal 104 to generate an RF output signal 106. Specifically, the conventional switching mixer 100 up-converts the baseband signal 102 to a frequency of the LO signal 104. Consequently, the RF output signal 106 is a frequency translated version of the baseband signal 102.

The RF output signal 106 generated by the conventional switching mixer 100 includes attenuated copies or replicas of the baseband signal 102 at odd multiples of the LO frequency. Two main causes of these harmonics are the shape of the LO signal 104 and the switching action of the conventional switching mixer 100.

The waveform of the LO signal 104 usually resembles a square wave more than a sinusoidal wave, especially at low frequencies of the LO signal 104. Unlike a single-tone sinusoidal waveform, a square waveform contains harmonics at odd multiples of the fundamental frequency of the LO signal 104. As shown in FIG. 1, these harmonics create copies of the baseband signal 102 at odd multiples of the frequency of the LO signal 104.

The harmonics within the RF output signal 106, however, can also appear in the RF output signal 106 when a sinusoidal LO signal 104 is used. That is, due to the inherent switching action of the LO transistor pairs comprising the conventional switching mixer 100, harmonics at odd multiples of the fundamental frequency of the LO signal 104 can be produced even with a sinusoidal LO signal 104. To attenuate these unwanted harmonics, post-filtering of the RF output signal 106 is required.

Figure 2:
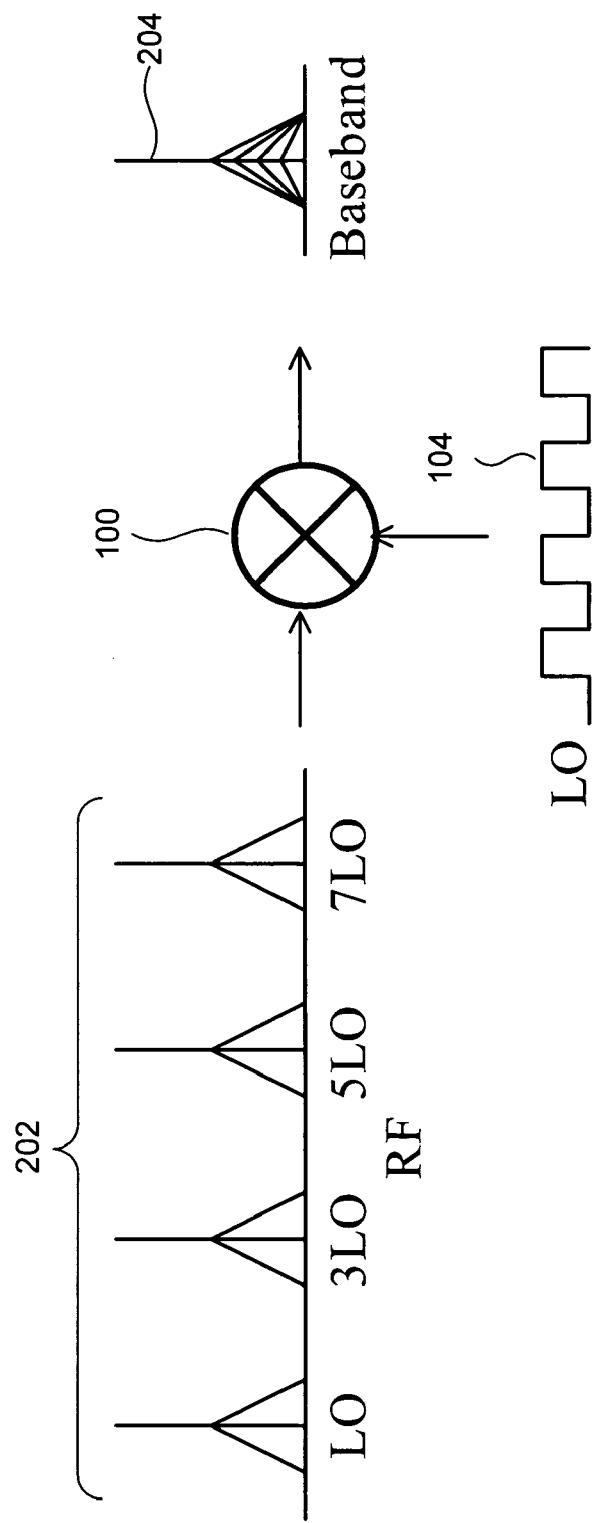
FIG. 2 illustrates the conventional switching mixer depicted in FIG. 1 operating in an RF receiver.

FIG. 2 illustrates the conventional switching mixer 100 used in an RF receiver. In a direct down-conversion receiver, the conventional switching mixer 100 uses the LO signal 104 to down-convert an RF input signal 202 to a baseband output signal 204. Specifically, the conventional switching mixer 100 down-converts the RF input signal 202 to a baseband frequency. Consequently, the baseband output signal 204 is a frequency translated version of the RF input signal 202.

The output of the conventional switching mixer 100 used in a direct down-conversion receiver is also affected by harmonics of the LO signal 104. Specifically, when the RF input signal 202 contains component RF input signals at odd multiples of the frequency of the LO signal 104 (e.g., harmonics of a main component of the RF input signal 202) the baseband output signal 204 will contain attenuated versions of these component signals at the frequency of the baseband output signal 204. As shown in FIG. 2, these component input signals directly interfere with each other (i.e., overlap in frequency) at the output of the conventional switching mixer 100. To attenuate these unwanted component input signals, pre-filtering of the RF input signal 202 is required prior to down-conversion. The overlap of component input signals at a desired baseband frequency can be caused by the shape of the LO signal 104 or the switching action of the conventional switching mixer 100.

Overall, during up-conversion, the conventional switching mixer 100 generates replicas of a baseband input signal in an RF output signal at odd multiples of a fundamental frequency of an LO signal. During down-conversion, the conventional switching mixer 100 generates overlapping replicas of RF input signals in a baseband output signal originally located at odd multiples of a fundamental frequency of an LO signal.

Figure 3A:
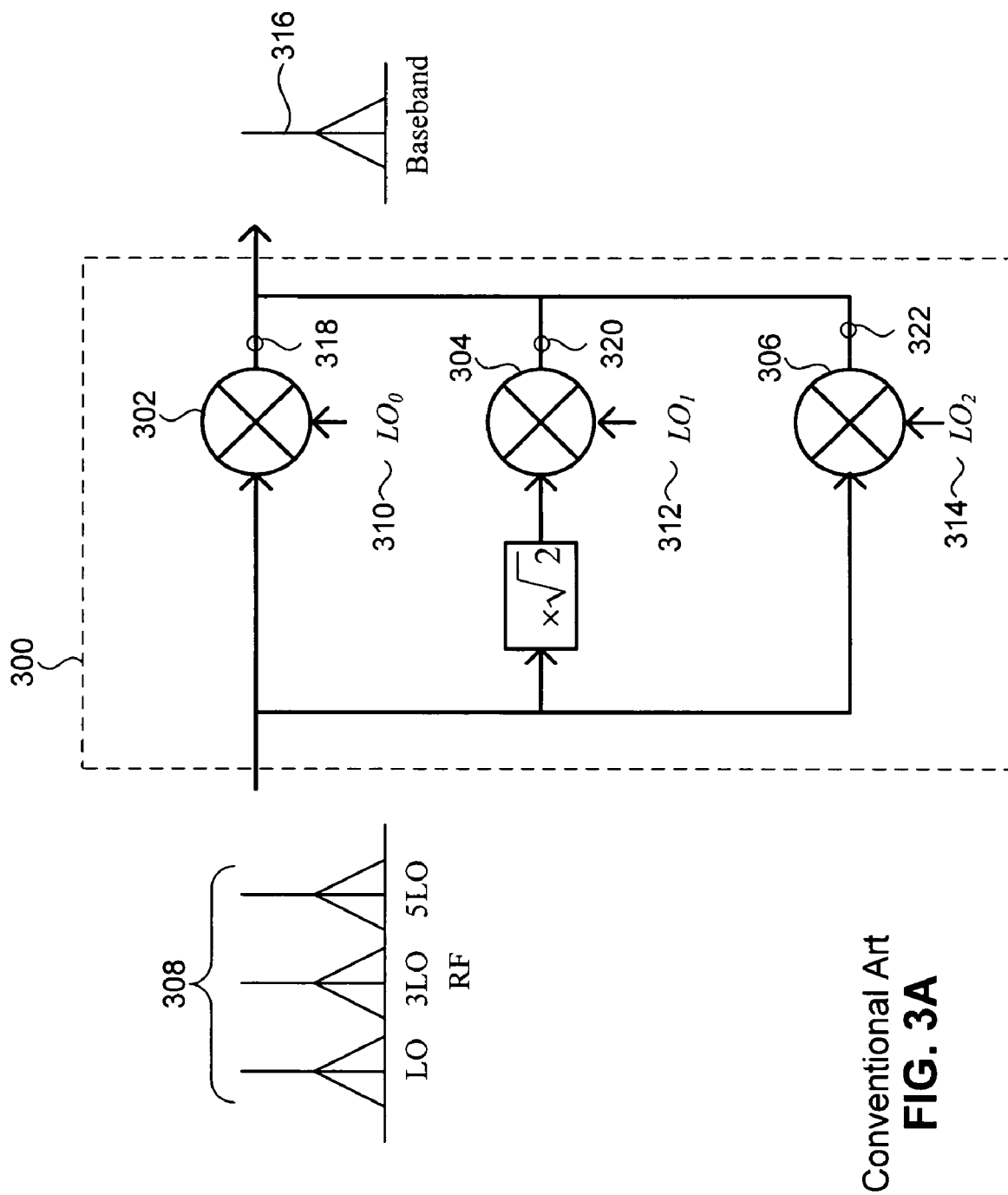
FIG. 3A illustrates a conventional down-converter mixer for producing an output signal with substantially canceled baseband versions of component RF input signals located at third and fifth harmonics of a local oscillator (LO) signal.

The paper by Jeffrey A. Weldon et al., entitled "A 1.75-GHz Highly Integrated Narrow-Band CMOS Transmitter With Harmonic-Rejection Mixers," in the Institute of Electrical and Electronics Engineers (IEEE) Journal of Solid-State Circuits, Vol. 36, No. 12, Dec. 2001, pp. 2003-2015, herein incorporated by reference in its entirety, presents an alternative to filtering unwanted harmonics. FIG. 3A illustrates a conventional down-converter mixer 300 suggested in the paper.

As shown in FIG. 3A, the conventional down-converter mixer 300 includes a first mixer 302, a second mixer 304 and a third mixer 306 connected in parallel. The conventional down-converter 300 receives an RF input signal 308 and produces a baseband output signal 316. The first mixer 302 uses a first LO signal 310 to down-convert the RF input signal 308 to a first baseband output signal 318. The second mixer 304 uses a second LO signal 312 to down-convert the RF input signal 308 to a second baseband output signal 320. The third mixer 306 uses a third LO signal 314 to down-convert the RF input signal 308 to a third baseband output signal 322. The first baseband output signal 318, the second baseband output signal 320 and the third baseband output signal 322 are summed together or combined to produce the baseband output signal 316.

Figure 3B:
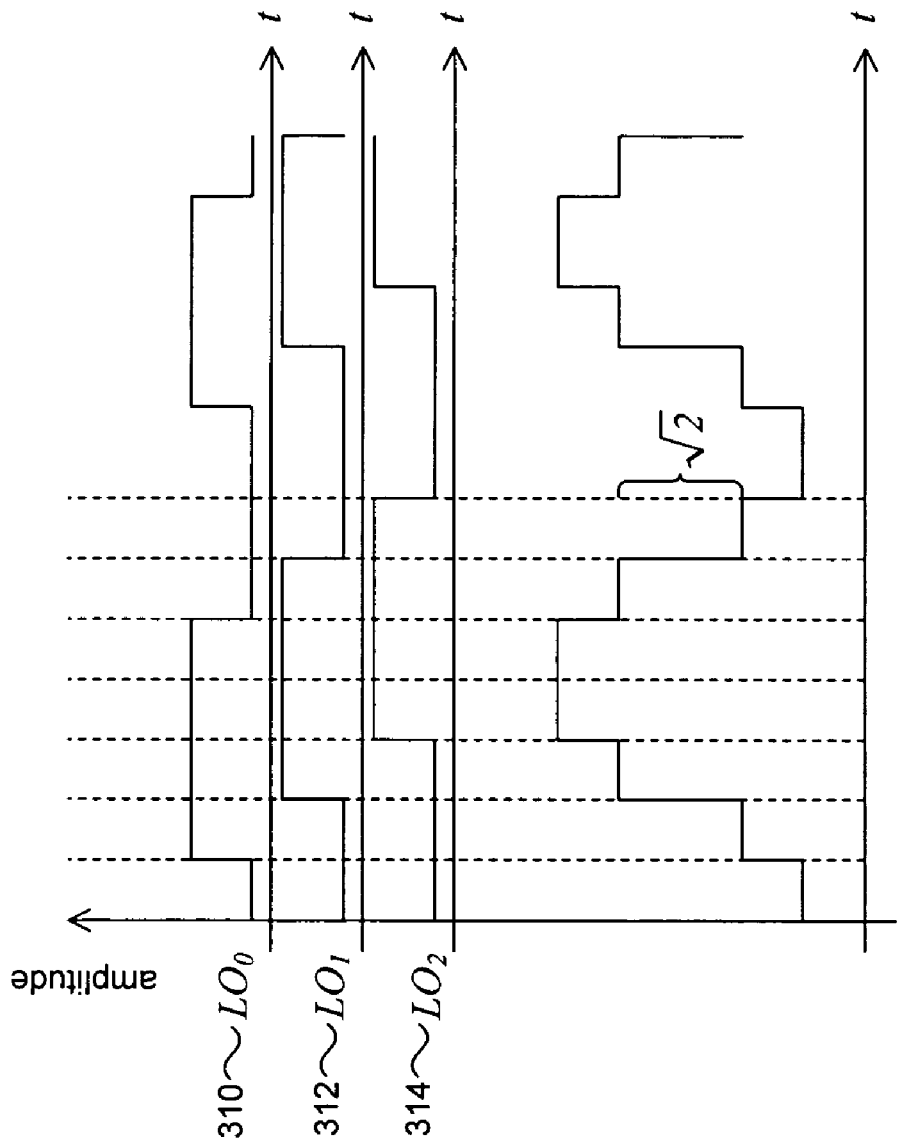
FIG. 3B illustrates first, second and third versions of an LO signal depicted in FIG. 3A.

As shown in FIG. 3B, the first LO signal 310 is a phase-shifted version of the second LO signal 312. Specifically, the second LO signal 312 is phase-shifted by −45° to generate the first LO signal 310. The third LO signal 314 is also a phase-shifted version of the second LO signal 312. Specifically, the second LO signal 312 is phase-shifted by 45° to generate the third LO signal 314. Further, as shown in FIG. 3A, the RF input signal 308 is scaled by a gain scale factor equal to $\sqrt{2}$ prior to down-conversion by the second mixer 304.

The LO signals 310, 312 and 314 are each square waves at a given LO frequency. As shown in FIG. 3A, the RF input signal 308 contains component signals (e.g., harmonics) at odd multiples of the frequency of the LO signals 310, 312 and 314. That is, the RF input signal 308 includes component input signals at the third and fifth harmonics of the LO signal. A combined or effective LO signal 324 is shown in FIG. 3B. The effective LO signal 324 accounts for the gain scaling of the RF input signal 308 prior to down-conversion by the second mixer 304.

The scaling of the second baseband output signal 320 (via scaling the RF input signal 308) and the phase shifting of the LO signals 310, 312 and 314 provided by the conventional down-converter mixer 300 substantially cancels the baseband versions of the component input signals at the third and fifth harmonics of the LO signal. Specifically, the first baseband output signal 318, the second baseband output signal 320 and the third baseband output signal 322 each contain baseband versions of the component input signals at the third and fifth harmonics of the LO signal. Each of the baseband versions of the component input signals at the third and fifth harmonics of the LO signal are canceled when the individual baseband output signals are combined. This can be proven analytically by summing the Fourier series of the three square LO signals 310, 312 and 314. The Fourier series of the first LO signal 310 expanded up to the seventh-order is given by:

$$LO_0 = \frac{\sqrt{2}}{\pi}\left[(\cos(\omega t) - \sin(\omega t)) + \frac{1}{3}(\cos(3\omega t) + \sin(3\omega t)) - \frac{1}{5}(\cos(5\omega t) - \sin(5\omega t)) - \frac{1}{7}(\cos(7\omega t) + \sin(7\omega t)) + \ldots\right] \quad \text{(Eq. 1)}$$

The Fourier series of the second LO signal 312 expanded up to the seventh-order is given by:

$$LO_1 = \frac{2}{\pi}\left[\cos(\omega t) - \frac{1}{3}\cos(3\omega t) + \frac{1}{5}\cos(5\omega t) - \frac{1}{7}\cos(7\omega t) + \ldots\right] \quad \text{(Eq. 2)}$$

The Fourier series of the third LO signal 314 expanded up to the seventh-order is given by:

$$LO_2 = \frac{\sqrt{2}}{\pi} \left[ (\cos(\omega t) + \sin(\omega t)) + \frac{1}{3}(\cos(3\omega t) - \sin(3\omega t)) - \frac{1}{5}(\cos(5\omega t) + \sin(5\omega t)) - \frac{1}{7}(\cos(7\omega t) - \sin(7\omega t)) + \ldots \right] \quad \text{(Eq. 3)}$$

Summing the first LO signal 310, the second LO signal 312 and the third LO signal 314 yields:

$$LO_{total} = LO_0 + \sqrt{2} LO_1 + LO_2 \quad \text{(Eq. 4a)}$$

$$= \frac{4\sqrt{2}}{\pi} \cos(\omega t) - \frac{4\sqrt{2}}{7\pi} \cos(7\omega t) + \ldots \quad \text{(Eq. 4b)}$$

From Equation 4b, it is clear that summing the three square waveforms of the first LO signal 310, the second LO signal 312 and the third LO signal 314, after scaling the second LO signal 312, provides total rejection of the baseband version of the RF component input signals located at the third and fifth harmonics of the LO signal.

Figure 4:
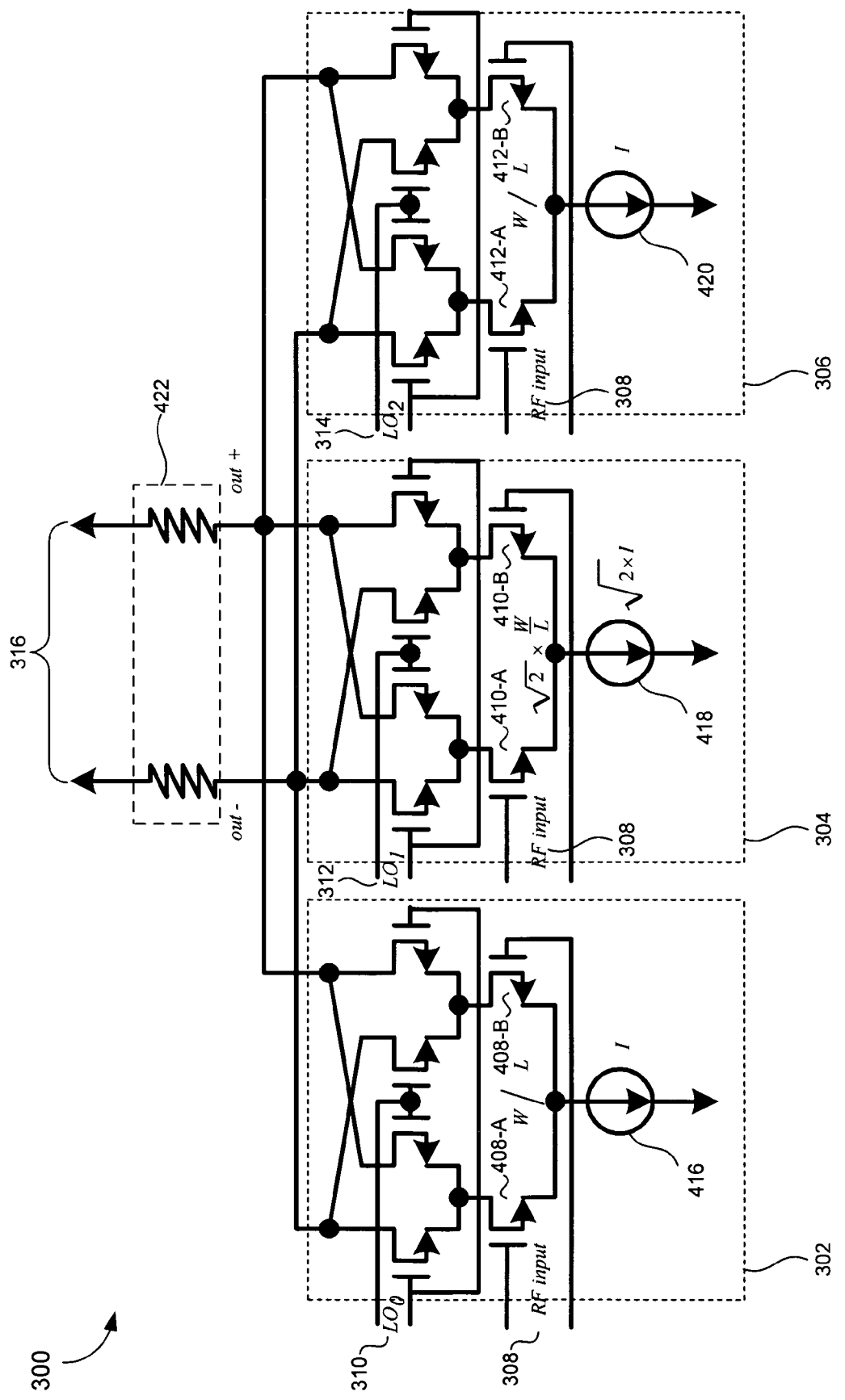
FIG. 4 illustrates a transistor-level implementation of the conventional down-converter mixer depicted in FIG. 3A.

FIG. 4 illustrates a transistor-level implementation of the conventional down-converter mixer 300. As shown in FIG. 4, the down-converter mixer 300 includes the first mixer 302, the second mixer 304 and the third mixer 306. The mixers 302, 304 and 306 are similarly configured as Gilbert cells. The mixers 302, 304 and 306 have respective input transistor pairs 408-A and 408-B, 410-A and 410-B and 412-A and 412-B. The mixers 302, 304 and 306 also include respective bias current sources 416, 418 and 420.

As further shown in FIG. 4, outputs of the mixers 302, 304 and 306 are coupled together and share a common resistive load 422. The combined output of the mixers 302, 304 and 306 provides the baseband output signal 316. The gain scaling factor of the second mixer 304 is provided by scaling the bias current source 418 by $\sqrt{2}$ (relative to the bias current sources 416 and 420) and by scaling the RF input transistor pair 410-A and 410-B by $\sqrt{2}$ (relative to the RF input transistor pairs 408-A/B and 412-A/B).

In real applications or actual implementation of the conventional down-converter mixer 300, the amount of harmonic cancellation is not ideal. Specifically, the amount of harmonic cancellation strongly depends on the phase and gain error of the conventional down-converter mixer 300. The phase error of the conventional down-converter mixer 300 is any deviation in phase difference between two adjacent mixer outputs from the ideal case of 45°. The gain error is measured as any deviation in gain from the ideal value of unity for the first mixer 302 and the third mixer 306, and $\sqrt{2}$ for the second mixer 304. For example, for a phase error of 1° and a gain error of 1%, the rejection of the third and fifth harmonics is only 35 dB as opposed to infinite when there is no phase or gain error.

Further, the conventional down-converter mixer 300 is incapable of rejecting higher-order harmonics contained within the RF input signal 308. That is, the conventional down-converter mixer 300 does not cancel baseband versions of component input signals located at the seventh and ninth harmonics of the LO signal. As shown in Equation 4b, the effective LO signal 324 at least contains seventh-order harmonic terms.

Therefore, there is a need for a mixer for use in an RF receiver capable of rejecting components of an RF input signal located at harmonics of an LO signal beyond the third and fifth LO harmonics. Specifically, there is a need for a mixer that can reject the baseband versions of the component signals located at the seventh and ninth order harmonics of an LO signal, as well as the baseband versions of the component signals at lower harmonics of the LO signal, to improve the fidelity of a baseband output signal. Further, there is a need for a mixer for use in an RF transmitter capable of rejecting harmonics within an RF output signal beyond the third and fifth LO harmonics. Specifically, there is a need for a mixer that can reject the seventh and ninth order harmonics in an RF output signal, as well as lower harmonics, to improve the fidelity of the RF output signal.

Figure 5A:
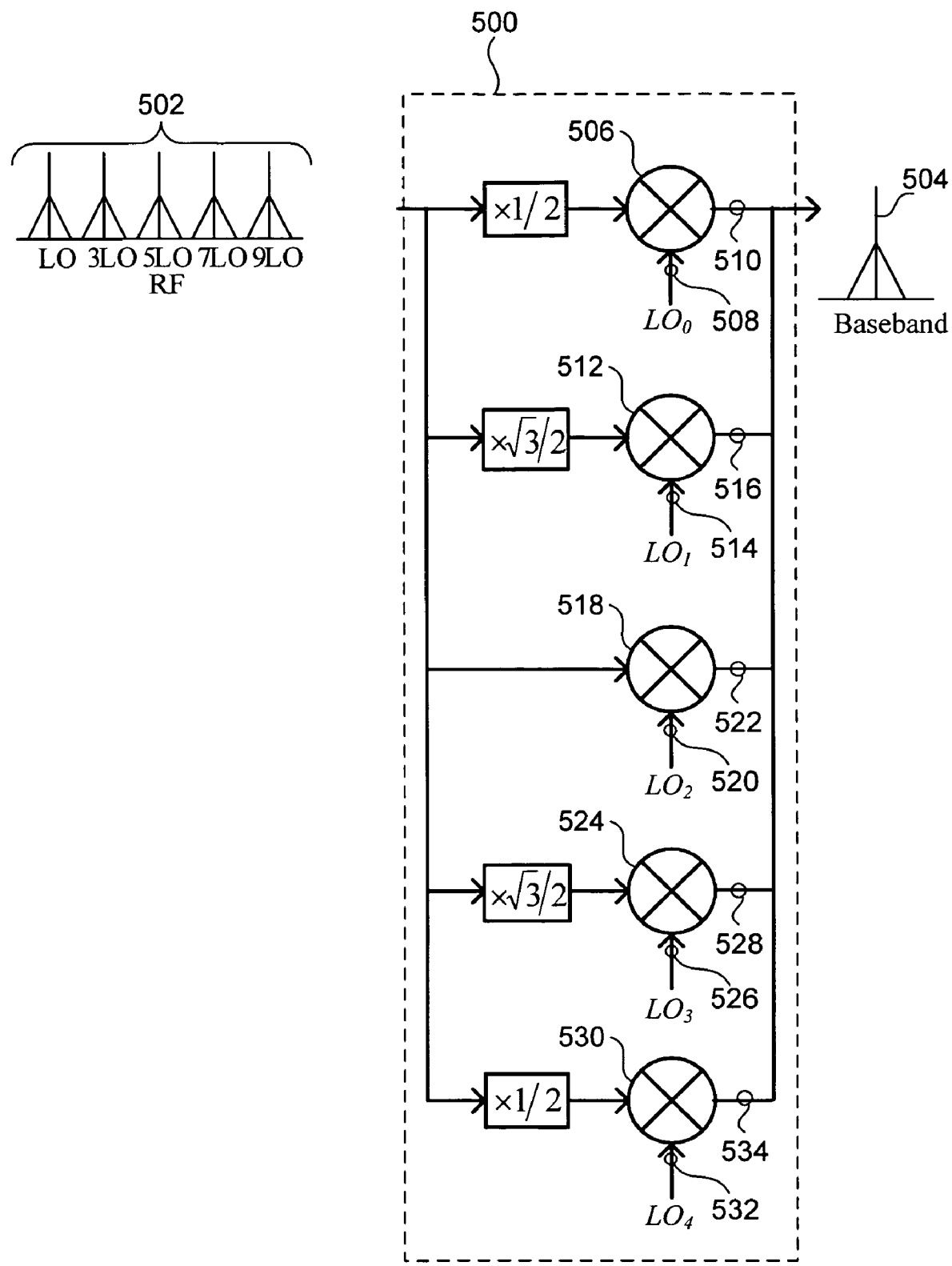
FIG. 5A illustrates a mixer of the present invention for producing an output signal with substantially canceled baseband versions of component RF input signals located at third, fifth, seventh and ninth harmonics of an LO signal.

FIG. 5A illustrates a mixer 500 of the present invention operating within an RF receiver. The mixer 500 includes five component mixers connected in parallel. The mixer 500 receives an RF input signal 502 and generates a baseband output signal 504 using multiple versions of an LO signal. The RF input signal 502 contains component RF input signals located at odd multiples of the LO frequency. Specifically, the component RF input signals are located at harmonics of the fundamental frequency of the LO signal used by the mixer 500.

As shown in FIG. 5A, a first mixer 506 uses a first LO signal 508 to generate a first frequency translated output signal 510 from the RF input signal 502. A second mixer 512 uses a second LO signal 514 to generate a second frequency translated output signal 516 from the RF input signal 502. A third mixer 518 uses a third LO signal 520 to generate a third frequency translated output signal 522 from the RF input signal 502. A fourth mixer 524 uses a fourth LO signal 526 to generate a fourth frequency translated output signal 528 from the RF input signal 502. A fifth mixer 530 uses a fifth LO signal 532 to generate a fifth frequency translated output signal 534 from the RF input signal 502.

The first frequency translated output signal 510, the second frequency translated output signal 516, the third frequency translated output signal 522, the fourth frequency translated output signal 528 and the fifth frequency translated output signal 534 are combined to form the output signal 504. The first 510, second 516, third 522, fourth 528 and fifth 534 frequency translated output signals can be baseband or IF signals. Likewise, the output signal 504 can be a baseband or IF signal.

Figure 5B:
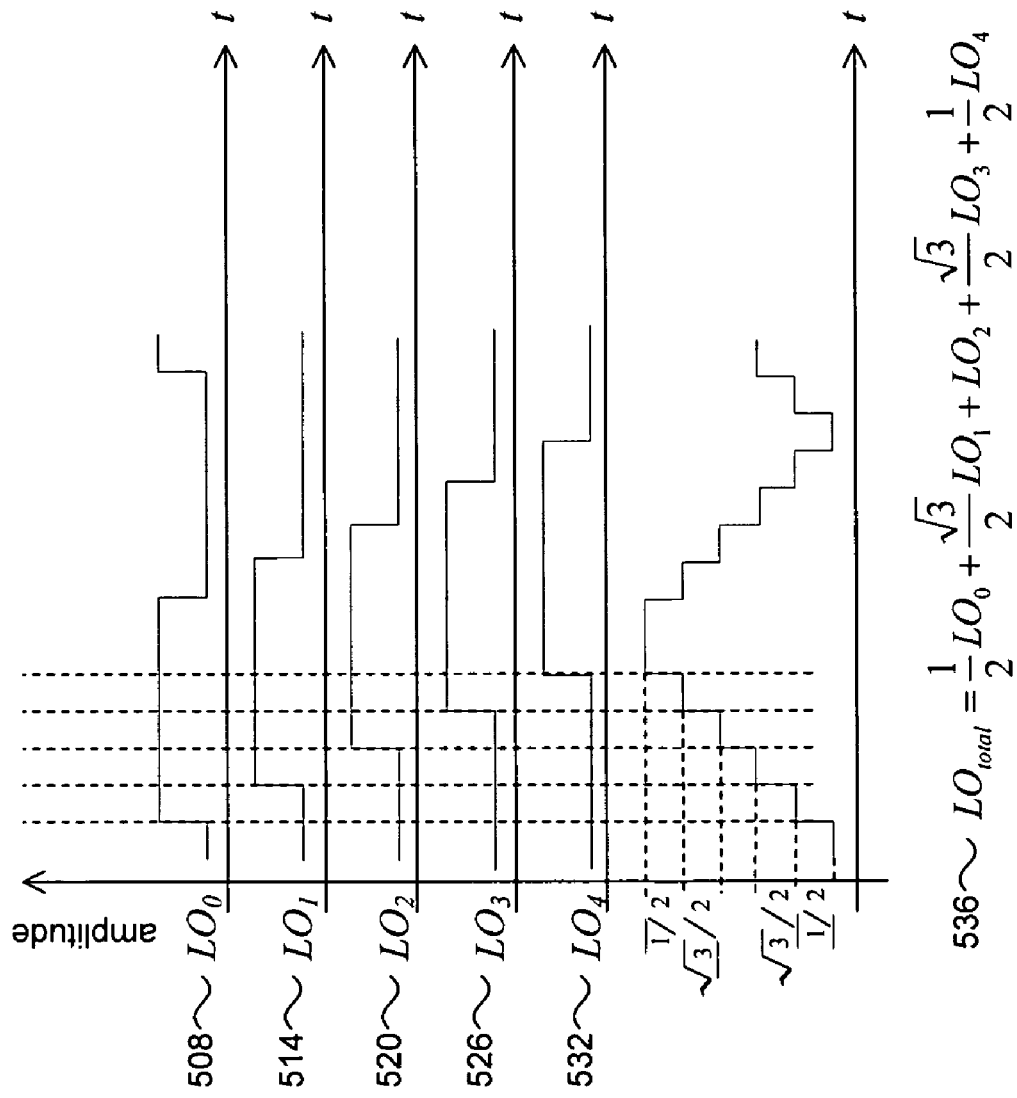
FIG. 5B illustrates first, second, third, fourth and fifth versions of an LO signal depicted in FIG. 5A.

As shown in FIG. 5B, the first LO signal 508, the second LO signal 514, the fourth LO signal 526 and the fifth LO signal 532 are phase-shifted versions of the third LO signal 520. Specifically, the third LO signal 520 is shifted by −60° to produce the first LO signal 508. The third LO signal 520 is shifted by −30° to produce the second LO signal 514. The third LO signal 520 is shifted by 30° to produce the fourth LO signal 526. The third LO signal 520 is shifted by 60° to produce the fifth LO signal 532. The LO signals 508, 514, 520, 526 and 532 each have the same frequency (i.e., the LO frequency). Further, the LO signals 508, 514, 520, 526 and 532 are square waves. A combined or effective LO signal 536 is shown in FIG. 3B.

FIG. 5A shows that the amplitude of the RF input signal 502 is scaled by the first mixer 506, the second mixer 512, the fourth mixer 524 and the fifth mixer 530 prior to down-conversion. Specifically, the first mixer 506 and the fifth mixer 530 scale the RF input signal 502 by a gain factor of approximately ½ prior to down-conversion. The second mixer 512 and the fourth mixer 524 scale the RF input signal 502 by a gain factor of approximately $\sqrt{3}/2$ prior to down-conversion. The third mixer 518 does not scale the RF input signal 502 prior to down-conversion (i.e., the gain factor of the third mixer 518 can be viewed as approximately equal to unity).

The scaling of the RF input signal 502 and the phase shifting of the component LO signals provided by the down-converter mixer 500 effectively cancels baseband versions of the component input signals located at the third, fifth, seventh and ninth harmonics of the LO signal. Specifically, the first baseband output signal 510, the second baseband output signal 516, the third baseband output signal 522, the fourth baseband output signal 528 and the fifth baseband output signal 534 contain baseband versions of the component RF input signals originally located at the third, fifth, seventh and ninth harmonics. These component input signals are down-converted to a desired baseband frequency and directly interfere with one another (i.e., overlap in frequency). The mixer 500 is arranged so that the overlapping baseband versions of the RF component input signals are substantially cancelled when the individual baseband output signals are combined. This can be proven analytically by summing the Fourier series of the five component LO signals.

The Fourier series of the first LO signal 508 expanded up to the ninth-order is given by:

$$LO_0 = \frac{2}{\pi}\left[\left(\frac{1}{2}\cos(\omega t) - \frac{\sqrt{3}}{2}\sin(\omega t)\right) + \right. \quad \text{(Eq. 5)}$$
$$\frac{1}{3}\cos(3\omega t) + \frac{1}{5}\left(\frac{1}{2}\cos(5\omega t) + \frac{\sqrt{3}}{2}\sin(5\omega t)\right) -$$
$$\left. \frac{1}{7}\left(\frac{1}{2}\cos(7\omega t) - \frac{\sqrt{3}}{2}\sin(7\omega t)\right) - \frac{1}{9}\cos(9\omega t) + \ldots\right]$$

The Fourier series of the second LO signal 514 expanded up to the ninth-order is given by:

$$LO_1 = \frac{2}{\pi}\left[\left(\frac{\sqrt{3}}{2}\cos(\omega t) - \frac{1}{2}\sin(\omega t)\right) + \right. \quad \text{(Eq. 6)}$$
$$\frac{1}{3}\sin(3\omega t) - \frac{1}{5}\left(\frac{\sqrt{3}}{2}\cos(5\omega t) + \frac{1}{2}\sin(5\omega t)\right) +$$
$$\left. \frac{1}{7}\left(\frac{\sqrt{3}}{2}\cos(7\omega t) - \frac{1}{2}\sin(7\omega t)\right) + \frac{1}{9}\cos(9\omega t) + \ldots\right]$$

The Fourier series of the third LO signal 520 expanded up to the ninth-order is given by:

$$LO_2 = \frac{2}{\pi}\left[\cos(\omega t) - \frac{1}{3}\cos(3\omega t) + \right. \quad \text{(Eq. 7)}$$
$$\left. \frac{1}{5}\cos(5\omega t) - \frac{1}{7}\cos(7\omega t) + \frac{1}{9}\cos(9\omega t) + \ldots\right]$$

The Fourier series of the fourth LO signal 526 expanded up to the ninth-order is given by:

$$LO_3 = \frac{2}{\pi}\left[\left(\frac{\sqrt{3}}{2}\cos(\omega t) + \frac{1}{2}\sin(\omega t)\right) - \right. \quad \text{(Eq. 8)}$$

-continued
$$\frac{1}{3}\sin(3\omega t) - \frac{1}{5}\left(\frac{\sqrt{3}}{2}\cos(5\omega t) - \frac{1}{2}\sin(5\omega t)\right) +$$
$$\left. \frac{1}{7}\left(\frac{\sqrt{3}}{2}\cos(7\omega t) + \frac{1}{2}\sin(7\omega t)\right) - \frac{1}{9}\cos(9\omega t) + \ldots\right]$$

The Fourier series of the fifth LO signal 532 expanded up to the ninth-order is given by:

$$LO_4 = \frac{2}{\pi}\left[\left(\frac{1}{2}\cos(\omega t) + \frac{\sqrt{3}}{2}\sin(\omega t)\right) + \right. \quad \text{(Eq. 9)}$$
$$\frac{1}{3}\cos(3\omega t) + \frac{1}{5}\left(\frac{1}{2}\cos(5\omega t) - \frac{\sqrt{3}}{2}\sin(5\omega t)\right) -$$
$$\left. \frac{1}{7}\left(\frac{1}{2}\cos(7\omega t) + \frac{\sqrt{3}}{2}\sin(7\omega t)\right) - \frac{1}{9}\cos(9\omega t) + \ldots\right]$$

Summing the component LO signals to generate the combined LO signal 536 yields:

$$LO_{total} = \frac{1}{2}LO_0 + \frac{\sqrt{3}}{2}LO_1 + LO_2 + \quad \text{(Eq. 10a)}$$
$$\frac{\sqrt{3}}{2}LO_3 + \frac{1}{2}LO_4$$
$$= \frac{6}{\pi}\cos(\omega t) + \ldots \quad \text{(Eq. 10b)}$$

From Equation 10b it is clear that summing the five square waveforms of the first LO signal 508, the second LO signal 514, the third LO signal 520, the fourth LO signal 526 and the fifth LO signal 532, after appropriate scaling, gives total rejection of the third, fifth, seventh and ninth harmonics of the component LO signals. In turn, baseband versions of the RF input component signals located at the third, fifth, seventh and ninth harmonics of the LO frequency are substantially cancelled by summing the output signals of the component mixers. Eleventh and higher harmonics of the LO frequency, however, may remain.

Figure 5C:
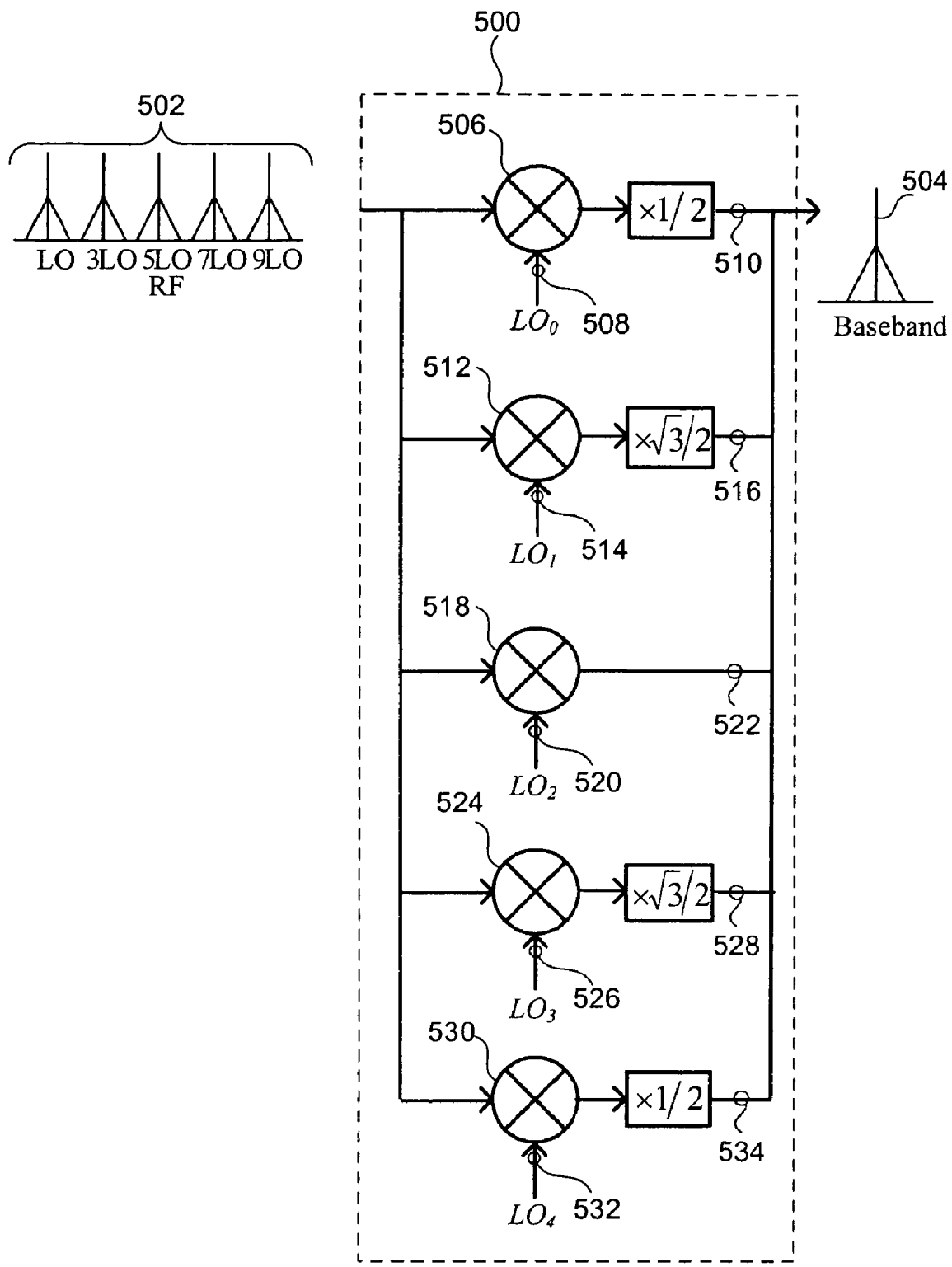
FIG. 5C illustrates the mixer of the present invention depicted in FIG. 5A with gain scale factors placed on individual mixer output signals instead of individual RF input signals.

As shown in FIG. 5A, the RF input signal 502 is scaled to achieve the harmonic rejection provided by an aspect of the present invention. It should be noted, however, that the present invention is not limited to this embodiment. Specifically, as shown in FIG. 5C, instead of scaling the RF input signal 502, the individual output signals (i.e., mixer outputs) can be scaled by the corresponding gain scale factors to achieve the harmonic rejection provided by an aspect of the present invention. Overall, the present invention encompasses any combination of mixer RF input scaling and/or mixer output scaling (i.e., scaling of the individual baseband output signals) to down-convert an RF input signal 502 to a baseband signal 504 such that baseband versions of component input signals located at third, fifth, seventh and ninth order harmonics of an LO signal are substantially cancelled.

The mixer 500 can also operate within a RF transmitter to substantially cancel third, fifth, seventh and ninth harmonics of an RF output signal. Specifically, the mixer 500 can be configured to receive a baseband input signal and to produce an RF output signal. The RF output signal can be generated by summing the component output signals produced by each of the component mixers. Each component output signal can contain third, fifth, seventh and ninth order harmonics. The third, fifth, seventh and ninth order harmonics of each component output signal are cancelled by summing the component output signals together. The scaling of the component output signals of the component mixers and the phase shifting of the LO signals enables the third, fifth, seventh and ninth order harmonics to be substantially cancelled or reduced. The component output signals can be either scaled directly, indirectly (i.e., by scaling the corresponding baseband input signals) or using a combination of direct and indirect scaling to achieve the gain scaling specified by an aspect of the present invention.

Figure 6:
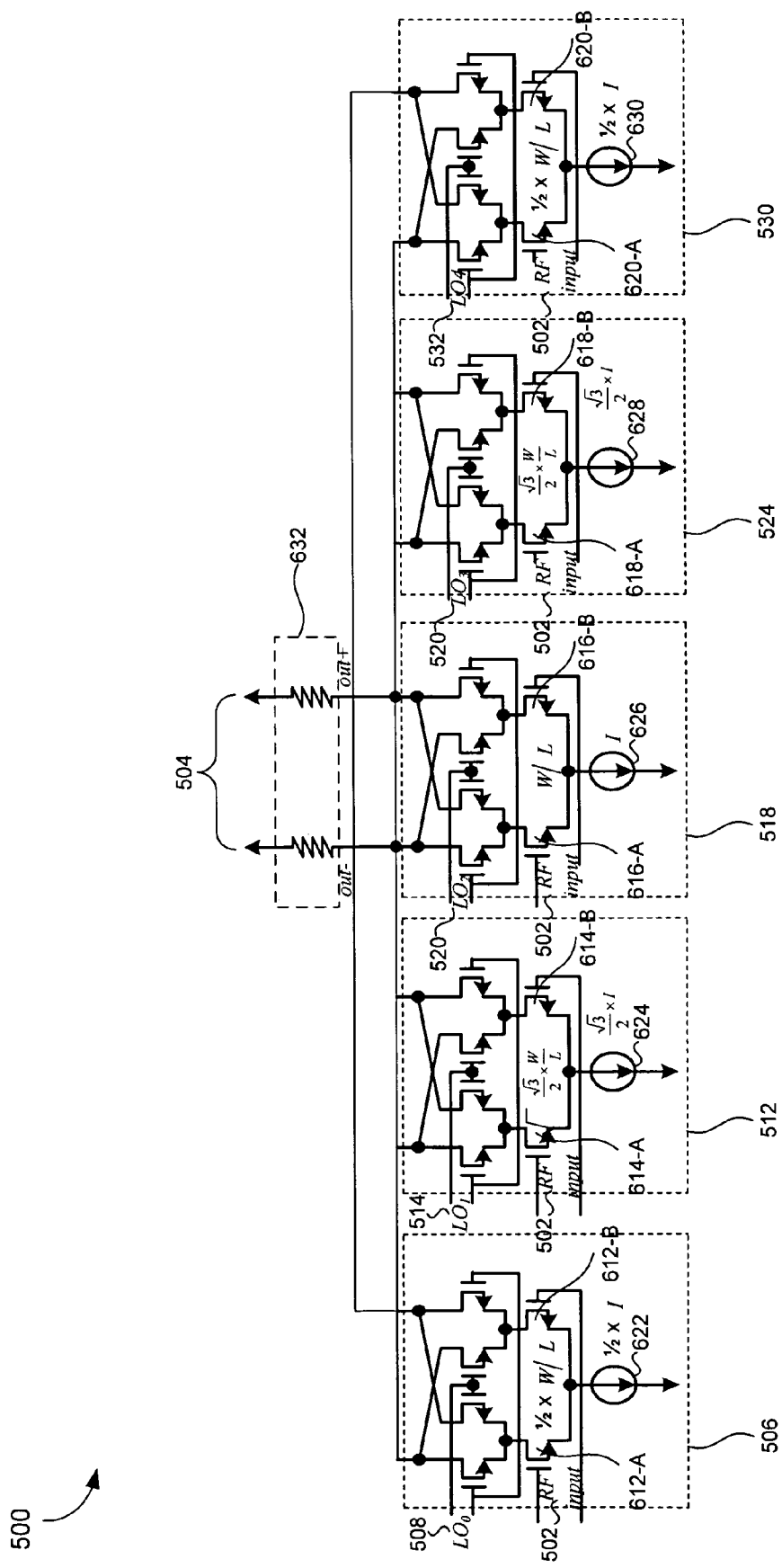
FIG. 6 illustrates a transistor-level implementation of the mixer depicted in FIG. 5A.

FIG. 6 illustrates a transistor-level implementation of the mixer 500 operating in an RF receiver. As shown in FIG. 6, the mixer 500 includes the first mixer 506, the second mixer 512, the third mixer 518, the fourth mixer 524 and the fifth mixer 532. The mixers 506, 512, 518, 524 and 532 are similarly configured as Gilbert cells using Metal-Oxide-Semiconductor Field-Effect Transistors (MOSFETs or FETs). As an alternative, the mixers 506, 512, 518, 524 and 532 can be configured as Gilbert cells using Bipolar Junction Transistors (BJTs). The mixers 506, 512, 518, 524 and 532 have respective input transistor pairs 612-A and 612-B, 614-A and 614-B, 616-A and 616-B, 618-A and 618-B, and 620-A and 620-B. The mixers 506, 512, 518, 524 and 532 also include respective bias current sources 622, 624, 626, 628 and 630.

As further shown in FIG. 6, outputs of the mixers 506, 512, 518, 524 and 532 are coupled together and share a common resistive load 632. The combined output of the mixers 506, 512, 518, 524 and 532 provides the baseband output signal 504. The gain scaling factors of the first mixer 506, the second mixer 512, the fourth mixer 524 and the fifth mixer 532 are realized by scaling a size of the corresponding bias current sources and input transistors pairs with respect to the third mixer 518. The size of the bias current sources 622 and 630 are approximately ½ the size of the bias current source 626. The size of the bias current sources 624 and 628 are approximately $\sqrt{3}/2$ the size of the bias current source 626. Further, the size of the input transistors 612-A/B and 620-A/B (i.e., the channel length, L, and channel width, W) are approximately ½ the size of the input transistor pair 616-A/B. The size of the input transistors 614-A/B and 618-A/B (i.e., the channel length, L, and channel width, W) are approximately $\sqrt{3}/2$ the size of the input transistor pair 616-A/B.

As previously mentioned, the transistor-level implementation of the mixer 500 depicted in FIG. 6 can be modified to operate in a RF transmitter to substantially cancel the third, fifth, seventh and ninth harmonics in an RF output signal. To do so, the input transistor pairs 612-A/B, 614-A/B, 616-A/B, 618-A/B and 620-A/B can receive a baseband input signal and generate an RF output signal across the load 632 substantially devoid of third, fifth, seventh and ninth order harmonics. Further, as previously mentioned, the respective signal inputs or outputs of each component mixer (or any combination thereof) can be scaled in accordance with an aspect of the present invention in lieu of only sizing the bias current sources and input transistor pairs as shown in FIG. 6. Attenuators and/or filters can be used to achieve the desired scaling of the component output signals of each mixer as specified by an aspect of the present invention. Overall, such alternative scaling implementations are available to the transistor-level implementation of the mixer 500 depicted in FIG. 6 for use in an RF transmitter or a RF receiver.

It is to be appreciated by those skilled in the art(s) that an aspect of the present invention is not limited to the embodiment depicted in FIG. 6. That is, it is expected that one skilled in the art(s) can appreciate from the discussion herein that any switching mixer, including passive mixers, can be used to achieve the harmonic cancellation specified by an aspect of the present invention.

Figure 7:
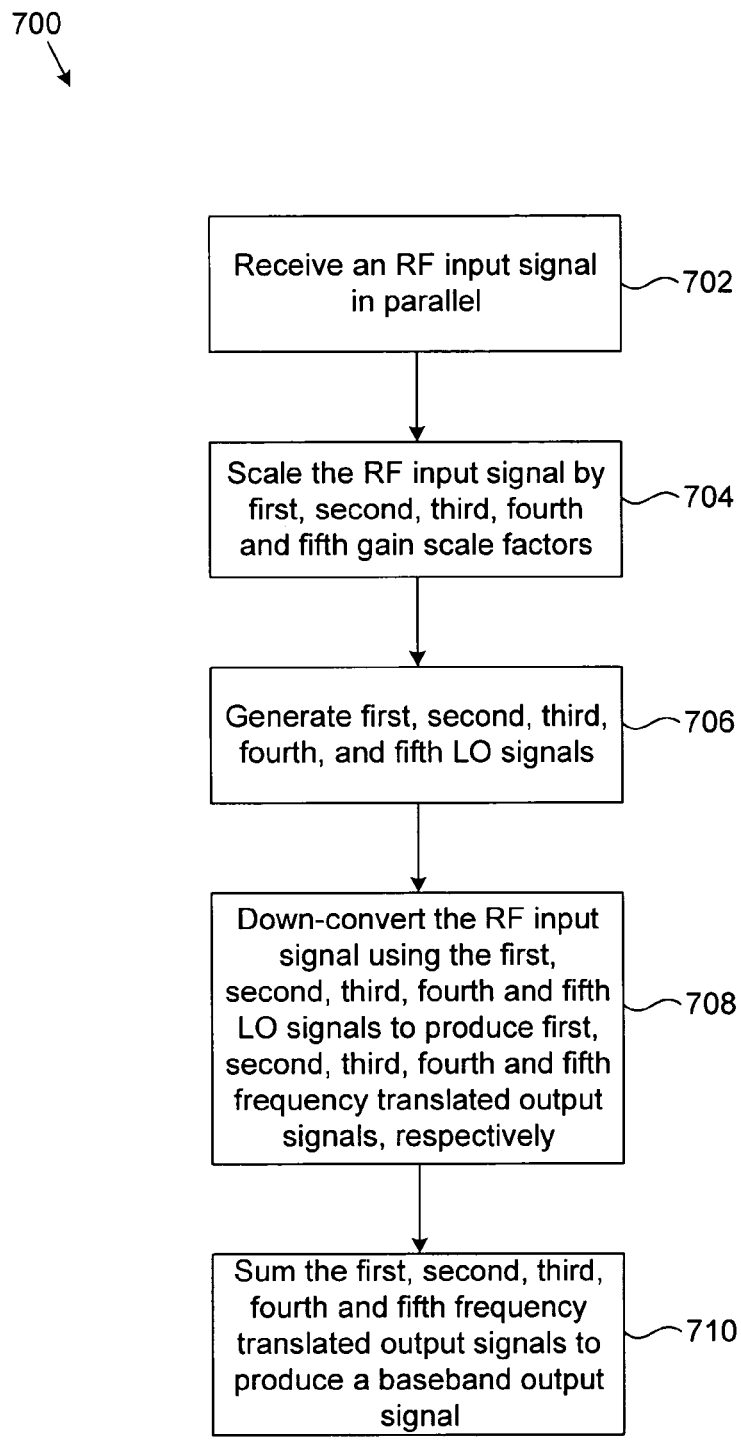
FIG. 7 provides a flowchart that illustrates operational steps for producing an output signal with substantially canceled baseband versions of component RF input signals located at third, fifth, seventh and ninth harmonics of an LO signal in accordance with an aspect of the present invention.

FIG. 7 provides a flowchart 700 that illustrates operational steps in accordance with an aspect of the present invention for producing an improved baseband output signal (or IF output signal) during down-conversion by substantially canceling baseband versions of RF component input signals located at third, fifth, seventh and ninth harmonics of an LO signal. The invention is not limited to this operational description. Rather, it will be apparent to persons skilled in the relevant art(s) from the teachings herein that other operational control flows are within the scope and spirit of the present invention. In the following discussion, the steps in FIG. 7 are described.

At step 702, an RF input signal is received by five component mixers connected in parallel. The RF input signal comprises component signals located at the third and fifth harmonics of an LO frequency. The RF input signal can further comprise component signals located at the seventh and ninth harmonics of the LO frequency.

At step 704, the RF input signal is scaled by first, second, third, fourth and fifth gain scale factors. The first and fifth gain scale factors are approximately equal to ½. The second and fourth gain scale factors are approximately equal to $\sqrt{3}/2$. The third gain scale factor is approximately equal to unity.

At step 706, the first, second, third, fourth and fifth component LO signals are generated from an LO signal. The phases of the five component LO signals are approximately −60°, −30°, 0°, 30°, and 60°, respectively. The first, second, third, fourth and fifth LO signals each have approximately the same frequency and can be square waves.

At step 708, the five component LO signals are used by the five component mixers to down-convert the RF input signal to first, second, third, fourth and fifth frequency translated output signals. Each of the component frequency translated output signals can include overlapping baseband versions of the component input signals located at the third, fifth, seventh and ninth harmonics of the LO signal.

At step 710, the five component frequency translated output signals are combined to form a composite output signal. Overlapping baseband versions of the component input signals located at the third, fifth, seventh and ninth harmonics of the LO signal (to the extent each is present in the RF input signal) are canceled by the summation operation. Overall, baseband versions of the component input signals located at the third, fifth, seventh and ninth harmonics of the LO signal are substantially rejected to produce a composite output signal with improved fidelity and improved LO harmonic rejection.

The amplitudes of the five component frequency translated output signals are scaled by the scaling operation of step 704. Specifically, the amplitudes of the five component frequency translated output signals are indirectly scaled by appropriately scaling the signal inputs to each mixer. Alternative methods of scaling the five component frequency translated output signals are also possible. For example, the five component frequency translated output signals can be scaled directly. Overall, any combination of scaling the signal input or the output of a mixer can be used to achieve the appropriate scaling of the five component frequency translated output signals. Therefore, any such alternative can be implemented at step 704 described above.

Figure 8:
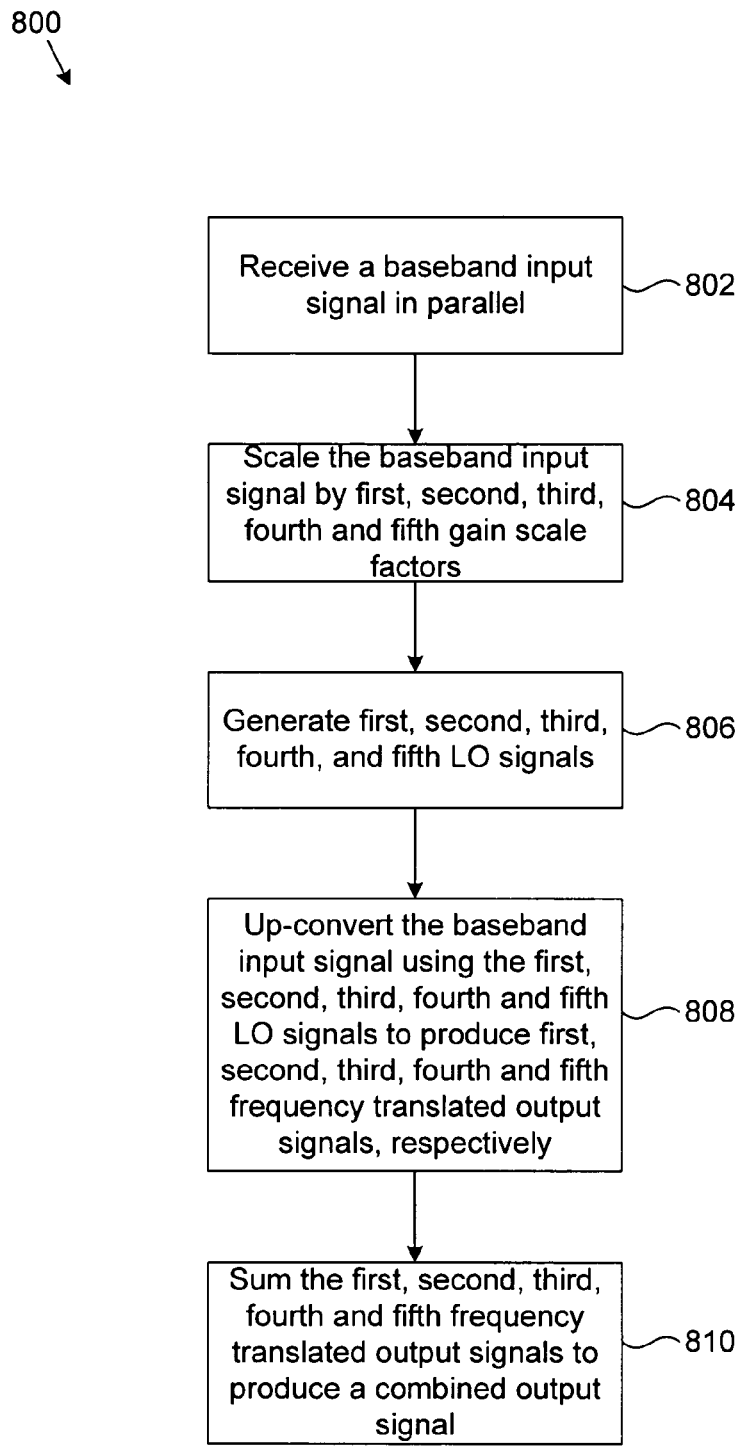
FIG. 8 provides a flowchart that illustrates operational steps for producing an output signal with substantially canceled third, fifth, seventh and ninth harmonics.

FIG. 8 provides a flowchart 800 that illustrates operational steps in accordance with an aspect of the present invention for producing an improved RF output signal during up-conversion by substantially rejecting the third, fifth, seventh and ninth harmonics of the RF output signal. The invention is not limited to this operational description. Rather, it will be apparent to persons skilled in the relevant art(s) from the teachings herein that other operational control flows are within the scope and spirit of the present invention. In the following discussion, the steps in FIG. 8 are described.

At step 802, an input signal is received by five component mixers connected in parallel. The input signal can be a baseband signal or an IF signal.

At step 804, the baseband input signal is scaled by first, second, third, fourth and fifth gain scale factors. The first and fifth gain scale factors are approximately equal to ½. The second and fourth gain scale factors are approximately equal to $\sqrt{3}/2$. The third gain scale factor is approximately equal to unity.

At step 806, first, second, third, fourth and fifth LO signals are generated. The phases of the five component LO signals are approximately −60°, −30°, 0°, 30°, and 60°, respectively. The first, second, third, fourth and fifth LO signals each have approximately the same frequency and can be square waves.

At step 808, the five component LO signals are used by the five component mixers to up-convert the baseband input signal to produce first, second, third, fourth and fifth frequency translated output signals.

At step 810, the five component frequency translated output signals are combined to form a combined output signal. The combined output signal can be an RF output signal. Third, fifth, seventh and ninth-order harmonics within the five component frequency translated output signals are canceled by the summation operation. Specifically, copies of the baseband input signal at the third, fifth, seventh and ninth harmonic frequencies of the LO signal are cancelled in the combined output signal to produce a combined output signal with improved fidelity and improved LO harmonic rejection.

The amplitudes of the five component frequency translated output signals are scaled by the scaling operation of step 704. Specifically, the amplitudes of the five component frequency translated output signals are indirectly scaled by appropriately scaling the signal inputs to each mixer. Alternative methods of scaling the five component frequency translated output signals are also possible. For example, the five component frequency translated output signals can be scaled directly. Overall, any combination of scaling the signal input or the output of a mixer can be used to achieve the appropriate scaling of the five component frequency translated output signals. Therefore, any such alternative can be implemented at step 804 described above.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A transmitter, comprising:
 a first mixer to produce a first frequency translated output signal from an input signal using a first version of a local oscillator (LO) signal;
 a second mixer to produce a second frequency translated output signal from the input signal using a second version of the LO signal;
 a third mixer to produce a third frequency translated output signal from the input signal using a third version of the LO signal;
 a fourth mixer to produce a fourth frequency translated output signal from the input signal using a fourth version of the LO signal; and
 a fifth mixer to produce a fifth frequency translated output signal from the input signal using a fifth version of the LO signal;
 wherein third, fifth, seventh and ninth harmonics of the first, second, third, fourth and fifth frequency translated output signals are substantially cancelled by summing the first, second, third, fourth and fifth frequency translated output signals to produce an output signal.

2. The transmitter of claim 1, wherein:
 a phase of the first version of the LO signal is phase-shifted by approximately −60° relative to a phase of the third version of the LO signal;
 a phase of the second version of the LO signal is phase-shifted by approximately −30° relative to the phase of the third version of the LO signal;
 a phase of the fourth version of the LO signal is phase-shifted by approximately 30° relative to the phase of the third version of the LO signal; and
 a phase of the fifth version of the LO signal is phase-shifted by approximately 60° relative to the phase of the third version of the LO signal.

3. The transmitter of claim 1, wherein:
 an amplitude of the first frequency translated output signal is scaled according to a first gain factor associated with the first mixer;
 an amplitude of the second frequency translated output signal is scaled according to a second gain factor associated with the second mixer;
 an amplitude of the third frequency translated output signal is scaled according to a third gain factor associated with the third mixer;
 an amplitude of the fourth frequency translated output signal is scaled according to a fourth gain factor associated with the fourth mixer; and
 an amplitude of the fifth frequency translated output signal is scaled according to a fifth gain factor associated with the fifth mixer.

4. The transmitter of claim 3, wherein:
 the first and fifth gain factors are approximately equal to ½;
 the second and fourth gain factors are approximately equal to $\sqrt{3}/2$; and
 the third gain factor is approximately equal to unity.

5. The transmitter of claim 3, wherein:
 a portion of the first gain factor is applied to one of:
  a signal input of the first mixer; or
  an output of the first mixer;
 a portion of the second gain factor is applied to one of:
  a signal input of the second mixer; or
  an output of the second mixer;
 a portion of the third gain factor is applied to one of:
  a signal input of the third mixer; or
  an output of the third mixer;
 a portion of the fourth gain factor is applied to one of:
  a signal input of the fourth mixer; or
  an output of the fourth mixer; and
 a portion of the fifth gain factor is applied to one of:
  a signal input of the fifth mixer; or
  an output of the fifth mixer.

6. The transmitter of claim 3, wherein the first, second, third, fourth and fifth mixers each comprise a Gilbert cell, each Gilbert cell comprising an input transistor pair coupled to a current source, an input of the input transistor pair coupled to the input signal.

7. The transmitter of claim 6, wherein a size of the input transistor pair and a size of the current source for each of the first, second, third, fourth and fifth mixers are scaled according to the first, second, third, fourth and fifth gain factors, respectively.

8. The transmitter of claim 1, wherein:
the first, second, third, fourth and fifth versions of LO signal have a relative phase shift such that third, fifth, seventh and ninth harmonics of the first, second, third, fourth and fifth frequency translated output signals are substantially cancelled by summing the first, second, third, fourth and fifth frequency translated output signals to produce an output signal.

9. A receiver, comprising:
a first mixer to produce a first frequency translated output signal from an input signal using a first version of a local oscillator (LO) signal, the input signal comprising component input signals at third, fifth, seventh and ninth harmonics of the LO signal;
a second mixer to produce a second frequency translated output signal from the input signal using a second version of the LO signal;
a third mixer to produce a third frequency translated output signal from the input signal using a third version of the LO signal;
a fourth mixer to produce a fourth frequency translated output signal from the input signal using a fourth version of the LO signal; and
a fifth mixer to produce a fifth frequency translated output signal from the input signal using a fifth version of the LO signal;
wherein baseband versions of the component input signals at the third, fifth, seventh and ninth harmonics of the LO signal within the first, second, third, fourth and fifth frequency translated output signals are substantially cancelled by summing the first, second, third, fourth and fifth frequency translated output signals to produce an output signal.

10. The receiver of claim 9, wherein:
a phase of the first version of the LO signal is phase-shifted by approximately −60° relative to a phase of the third version of the LO signal;
a phase of the second version of the LO signal is phase-shifted by approximately −30° relative to the phase of the third version of the LO signal;
a phase of the fourth version of the LO signal is phase-shifted by approximately 30° relative to the phase of the third version of the LO signal; and
a phase of the fifth version of the LO signal is phase-shifted by approximately 60° relative to the phase of the third version of the LO signal.

11. The receiver of claim 9, wherein:
an amplitude of the first frequency translated output signal is scaled according to a first gain factor associated with the first mixer;
an amplitude of the second frequency translated output signal is scaled according to a second gain factor associated with the second mixer;
an amplitude of the third frequency translated output signal is scaled according to a third gain factor associated with the third mixer;
an amplitude of the fourth frequency translated output signal is scaled according to a fourth gain factor associated with the fourth mixer; and
an amplitude of the fifth frequency translated output signal is scaled according to a fifth gain factor associated with the fifth mixer.

12. The receiver of claim 11, wherein:
the first and fifth gain factors are approximately equal to ½;
the second and fourth gain factors are approximately equal to $\sqrt{3}/2$; and
the third gain factor is approximately equal to unity.

13. The receiver of claim 11, wherein:
a portion of the first gain factor is applied to one of:
a signal input of the first mixer; or
an output of the first mixer;
a portion of the second gain factor is applied to one of:
a signal input of the second mixer; or
an output of the second mixer;
a portion of the third gain factor is applied to one of:
a signal input of the third mixer; or
an output of the third mixer;
a portion of the fourth gain factor is applied to one of:
a signal input of the fourth mixer; or
an output of the fourth mixer; and
a portion of the fifth gain factor is applied to one of:
a signal input of the fifth mixer; or
an output of the fifth mixer.

14. The receiver of claim 11, wherein the first, second, third, fourth and fifth mixers each comprise a Gilbert cell, each Gilbert cell comprising an input transistor pair coupled to a current source, an input of the input transistor pair coupled to the input signal.

15. The receiver of claim 14, wherein a size of the input transistor pair and a size of the current source for each of the first, second, third, fourth and fifth mixers are scaled according to the first, second, third, fourth and fifth gain factors, respectively.

16. A method for up-converting an input signal to a radio frequency (RF) output signal, comprising:
mixing the input signal using first, second, third, fourth and fifth versions of a local oscillator (LO) signal to produce first, second, third, fourth and fifth frequency translated output signals, respectively;
scaling amplitudes of the first, second, third, fourth and fifth frequency translated output signals according to first, second, third, fourth and fifth gain factors, respectively, wherein the first and fifth gain factors are approximately equal to ½, the second and fourth gain factors are approximately equal to $\sqrt{3}/2$, and the third gain factor is approximately equal to unity; and
summing the first, second, third, fourth and fifth frequency translated output signals to produce the RF output signal;
wherein third, fifth, seventh and ninth harmonics of the first, second, third, fourth and fifth frequency translated output signals are substantially cancelled by summing the first, second, third, fourth and fifth frequency translated output signals.

17. The method of claim 16, wherein mixing further comprises:
shifting a phase of the first version of the LO signal by −60° relative to a phase of the third version of the LO signal;
shifting a phase of the second version of the LO signal by −30° relative to the phase of the third version of the LO signal;
shifting a phase of the fourth version of the LO signal by 30° relative to the phase of the third version of the LO signal; and
shifting a phase of the fifth version of the LO signal by 60° relative to the phase of the third version of the LO signal.

18. The method of claim 16, wherein scaling comprises:
scaling an amplitude of a first version of the input signal mixed with the first version of the LO signal by the first gain factor;
scaling an amplitude of a second version of the input signal mixed with the second version of the LO signal by the second gain factor;
scaling an amplitude of a third version of the input signal mixed with the third version of the LO signal by the third gain factor;
scaling an amplitude of a fourth version of the input signal mixed with the fourth version of the LO signal by the fourth gain factor; and
scaling an amplitude of a fifth version of the input signal mixed with the fifth version of the LO signal by the fifth gain factor.

19. A method for down-converting a radio frequency (RF) input signal to a baseband output signal, comprising:
mixing the RF input signal using first, second, third, fourth and fifth versions of a local oscillator (LO) signal to produce first, second, third, fourth and fifth frequency translated output signals, respectively, the RF input signal comprising component RF signals at third, fifth, seventh, and ninth harmonics of the LO signal;
scaling amplitudes of the first, second, third, fourth and fifth frequency translated output signals according to first, second, third, fourth and fifth gain factors, respectively, wherein the first and fifth gain factors are approximately equal to ½, the second and fourth gain factors are approximately equal to $\sqrt{3}/2$ and the third gain factor is approximately equal to unity; and
summing the first, second, third, fourth and fifth frequency translated output signals to produce the baseband output signal;
wherein baseband versions of the component RF signals at the third, fifth, seventh and ninth harmonics of the LO signal within the first, second, third, fourth and fifth frequency translated output signals are substantially cancelled by summing the first, second, third, fourth and fifth frequency translated output signals.

20. The method of claim 19, wherein mixing further comprises:
shifting a phase of the first version of the LO signal by $-60°$ relative to a phase of the third version of the LO signal;
shifting a phase of the second version of the LO signal by $-30°$ relative to a phase of the third version of the LO signal;
shifting a phase of the fourth version of the LO signal by $30°$ relative to a phase of the third version of the LO signal; and
shifting a phase of the fifth version of the LO signal by $60°$ relative to a phase of the third version of the LO signal.

21. The method of claim 19, wherein scaling comprises:
scaling an amplitude of a first version of the RF input signal mixed with the first version of the LO signal by the first gain factor;
scaling an amplitude of a second version of the RF input signal mixed with the second version of the LO signal by the second gain factor;
scaling an amplitude of a third version of the RF input signal mixed with the third version of the LO signal by the third gain factor;
scaling an amplitude of a fourth version of the RF input signal mixed with the fourth version of the LO signal by the fourth gain factor; and
scaling an amplitude of a fifth version of the RF input signal mixed with the fifth version of the LO signal by the fifth gain factor.

* * * * *